(12) United States Patent
Choi

(10) Patent No.: US 11,848,054 B2
(45) Date of Patent: Dec. 19, 2023

(54) MEMORY DEVICE DETERMINING PRECHARGE TIME BASED ON A NUMBER OF TIMES THAT A PROGRAM VOLTAGE IS APPLIED TO WORD LINE AND OPERATING METHOD OF MEMORY DEVICE

(71) Applicant: SK hynix Inc., Gyeonggi-do (KR)

(72) Inventor: Jung Sik Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 127 days.

(21) Appl. No.: 17/469,214

(22) Filed: Sep. 8, 2021

(65) Prior Publication Data
US 2022/0328100 A1   Oct. 13, 2022

(30) Foreign Application Priority Data
Apr. 7, 2021 (KR) .......... 10-2021-0044983

(51) Int. Cl.
G11C 16/04 (2006.01)
G11C 16/10 (2006.01)
G11C 16/08 (2006.01)
G11C 16/34 (2006.01)
G11C 16/24 (2006.01)

(52) U.S. Cl.
CPC .......... *G11C 16/10* (2013.01); *G11C 16/0483* (2013.01); *G11C 16/08* (2013.01); *G11C 16/24* (2013.01); *G11C 16/3459* (2013.01)

(58) Field of Classification Search
CPC ..... G11C 16/10; G11C 16/0483; G11C 16/08; G11C 16/24; G11C 16/3459; G11C 11/5628; G11C 2211/5621; G11C 16/30; G11C 16/32; G11C 16/34; G11C 7/12; G11C 8/08; G11C 8/14
USPC ...................................... 365/185.22
See application file for complete search history.

(56) References Cited

U.S. PATENT DOCUMENTS 9,230,659 B2 *  1/2016  Choi ............... G11C 16/10
9,672,924 B2 *  6/2017  Cho ................ G11C 16/26

FOREIGN PATENT DOCUMENTS

KR   1020090123511 A   12/2009
KR    100962756 B1      6/2010

\* cited by examiner

*Primary Examiner* — Tha-O H Bui
(74) *Attorney, Agent, or Firm* — IP & T GROUP LLP

(57) ABSTRACT

A memory device may include a plurality of memory cells, a plurality of word lines, and a plurality of bit lines. The memory device may determine, when programming a first memory cell among the plurality of memory cells to a target program state, a precharge time based on a number of times that a program voltage is applied to a first word line connected to the first memory cell among the plurality of word lines, and may precharge the plurality of bit lines during the precharge time when executing a verify operation on the first memory cell.

11 Claims, 14 Drawing Sheets

FIG. 12

WL_GRP_1

| Number of times program voltage is applied | 1 | 2 | 3 | ... | MAX_CNT-1 | MAX_CNT |
|---|---|---|---|---|---|---|
| Precharge time | TIME_PRECH_1 | TIME_PRECH_1 | TIME_PRECH_1 | ... | TIME_PRECH_1 | TIME_PRECH_2 |

(MAX_CNT) = (Maximum count of program voltage application)
= (Reference count of program voltage application)

MEMORY DEVICE DETERMINING PRECHARGE TIME BASED ON A NUMBER OF TIMES THAT A PROGRAM VOLTAGE IS APPLIED TO WORD LINE AND OPERATING METHOD OF MEMORY DEVICE

CROSS-REFERENCE TO RELATED APPLICATION

The present application claims priority under 35 U.S.C. 119(a) to Korean patent application number 10-2021-0044983 filed on Apr. 7, 2021, which is incorporated herein by reference in its entirety.

TECHNICAL FIELD

The embodiments of the present disclosure relate to a memory device and an operating method of the memory device.

BACKGROUND

A memory system includes a data storage device that stores data on the basis of a request from a host, such as a computer, servers, a smartphone, a tablet PC, or other electronic devices. Examples of a memory system span from a traditional magnetic-disk-based hard disk drive (HDD) to a semiconductor-based data storage device such as a solid state drive (SSD), a universal flash storage device (UFS), or an embedded MMC (eMMC) device.

The memory system may further include a memory controller for controlling the memory device. The memory controller may receive a command from the host and, on the basis of the received command, may execute the command or control read/write/erase operations on the memory devices in the memory system. The memory controller may be used to execute firmware operations for performing a logical operation for controlling such operations.

When a memory system writes data to a memory device, the memory device can program the memory cell into a specific target program state and verify that the program state of the memory cell is the target program state.

SUMMARY

Embodiments of the present disclosure may provide a memory device and an operating method of the memory device capable of minimizing an increase in program time when increasing the time to precharge the bit line to prevent program failure.

In one aspect, embodiments of the present disclosure may provide a memory device including a plurality of memory cells, a plurality of word lines connected to at least one of the plurality of memory cells, and a plurality of bit lines connected to at least one of the plurality of memory cells.

The memory device may determine, when programming a first memory cell among the plurality of memory cells to a target program state, a precharge time for precharging the plurality of bit lines, based on a number of times that a program voltage is applied to a first word line connected to the first memory cell among the plurality of word lines.

The memory device may precharge the plurality of bit lines during the precharge time when executing a verify operation on the first memory cell.

As an example, the memory device may determine a first precharge time to be the precharge time when the number of times that the program voltage is applied to the first word line is less than a reference count of program voltage application, and may determine a second precharge time to be the precharge time when the number of times that the program voltage is applied to the first word line is equal to or greater than the reference count of program voltage application. In this case, the second precharge time may be longer than the first precharge time.

In another aspect, embodiments of the present disclosure may provide an operating method of a memory device including a plurality of memory cells, a plurality of word lines connected to at least one of the plurality of memory cells, and a plurality of bit lines connected to at least one of the plurality of memory cells.

The operating method of the memory device may include identifying, when programming a first memory cell among the plurality of memory cells to a target program state, a number of times that program voltage is applied to a first word line connected to the first memory cell among the plurality of word lines.

The operating method of the memory device may include determining a precharge time for precharging the plurality of bit lines, based on the number of times that the program voltage is applied to the first word line.

The operating method of the memory device may include precharging the plurality of bit lines during the precharge time when executing a verify operation on the first memory cell.

In another aspect, embodiments of the present disclosure may provide a memory device including memory cells commonly coupled to a word line and respectively coupled to bit lines and a control logic configured to perform one or more program loops on a target cell among the memory cells, each program loop including a program step and a verify step.

The control logic may perform the program step by applying a program voltage to the word line.

The control logic may perform the verify step by precharging the bit lines for a time amount corresponding to a current program loop among the program loops.

According to embodiments of the present disclosure, it is possible to minimize an increase in program time when increasing the time to precharge the bit line to prevent program failure.

BRIEF DESCRIPTION OF THE DRAWINGS

FIG. 12 is a diagram for describing another example in which the memory device according to embodiments of the present disclosure determines a reference count of program voltage application for the first word line group described in FIG. 10.

DETAILED DESCRIPTION

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
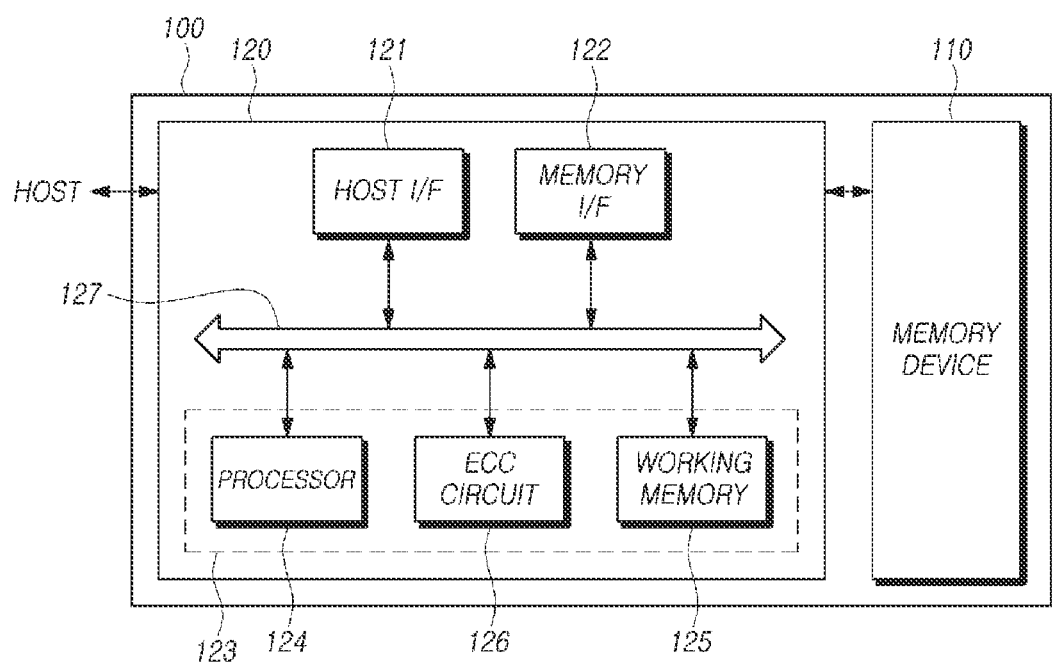
FIG. 1 is a schematic diagram illustrating a configuration of a memory system based on an embodiment of the disclosed technology.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory device having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. The processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In the present disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of the elements illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
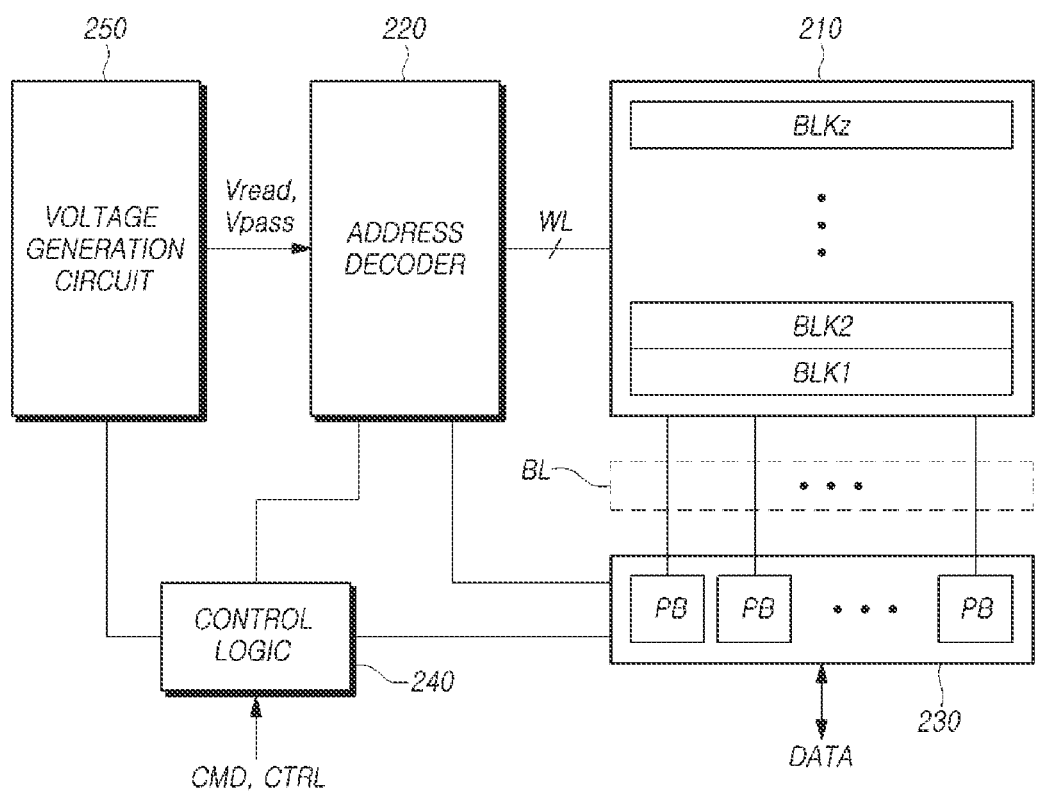
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage level of a memory cell and the voltage level is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
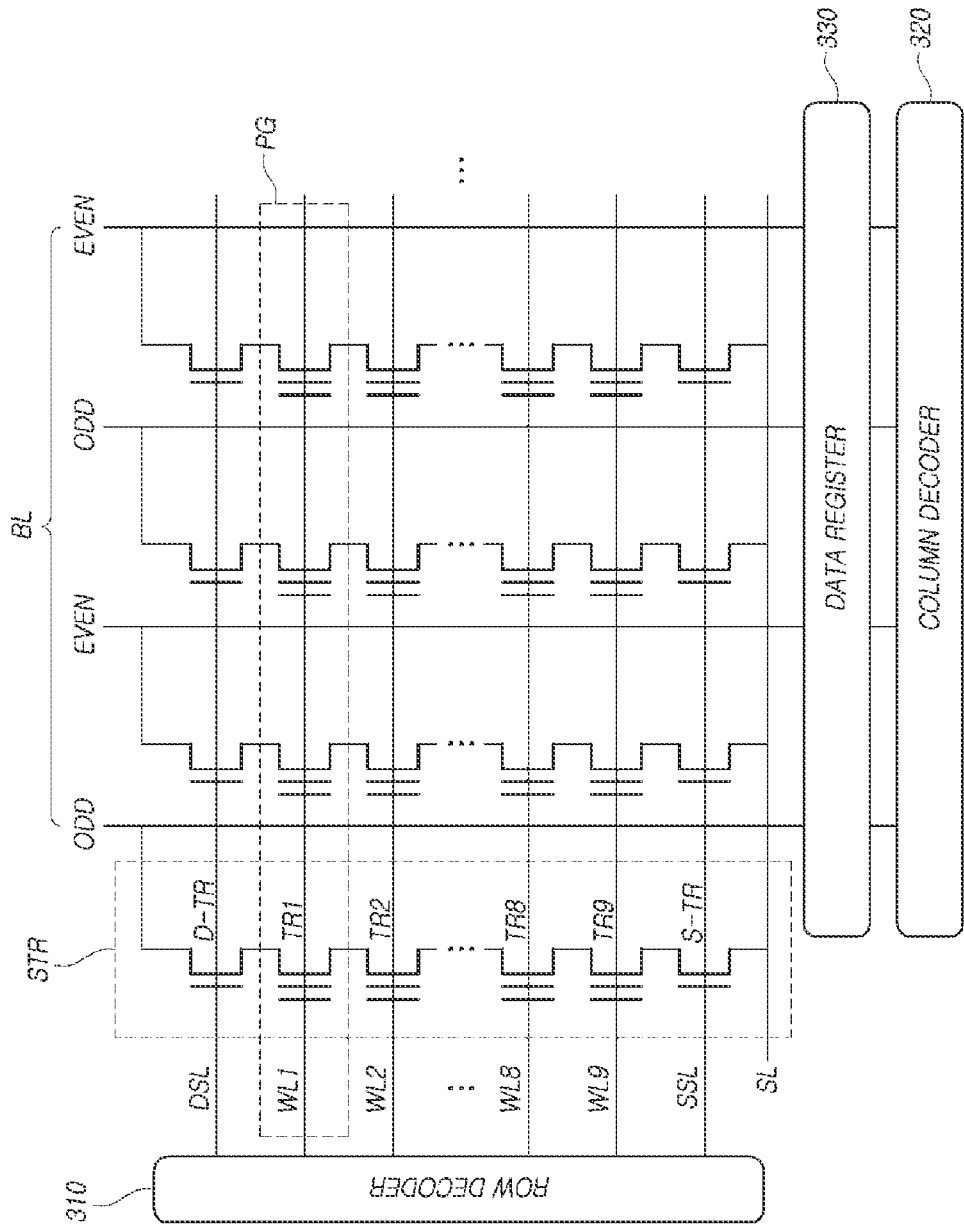
FIG. 3 is a diagram illustrating a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called a "page" PG, and a certain number of memory cells that are coupled in series can be called a "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of an odd-numbered bit line and an even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
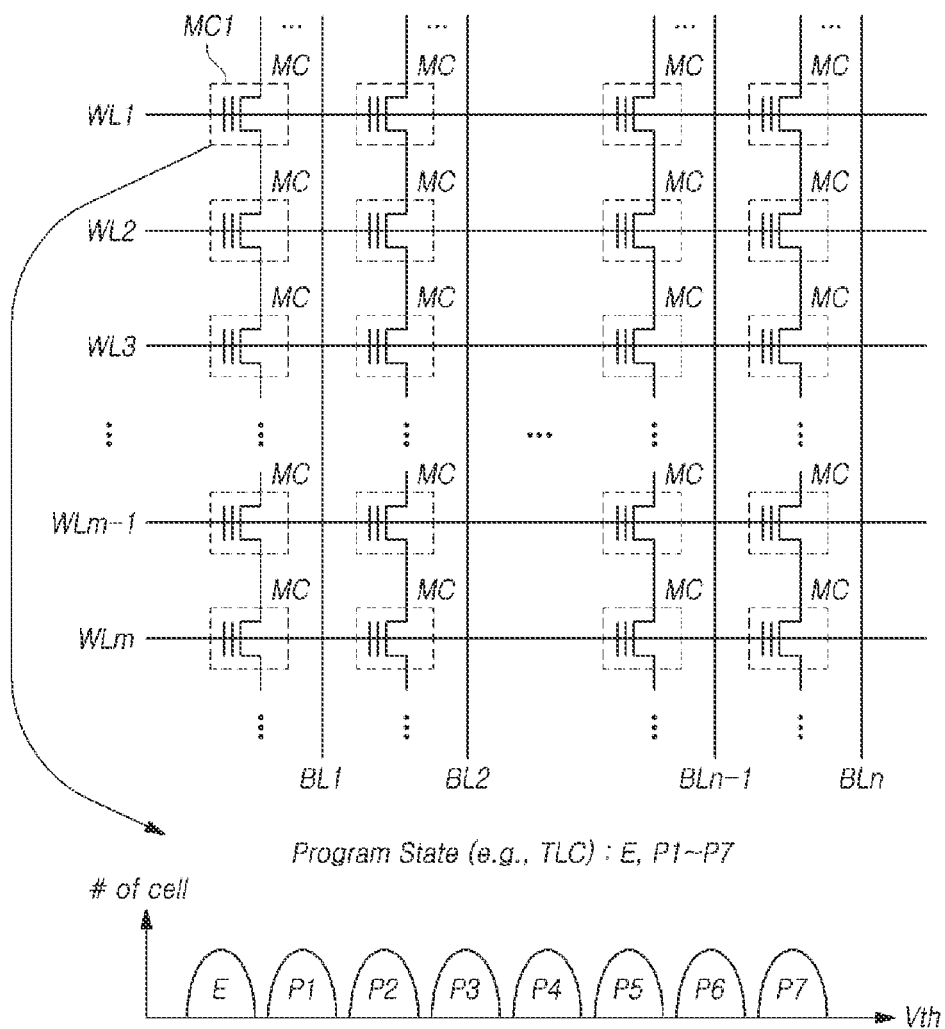
FIG. 4 illustrates a schematic structure of a memory device according to embodiments of the present disclosure.

FIG. 4 illustrates a schematic structure of a memory device 110 according to embodiments of the present disclosure.

Referring to FIG. 4, the memory device 110 may include a plurality of memory cells MC.

In addition, the memory device 110 may include a plurality of word lines WL1 to WLm, where m is a natural number greater than or equal to 2. In this case, each of the plurality of word lines WL1 to WLm may be connected to one or more of the plurality of memory cells MC included in the memory device 110. A plurality of word lines WL1 to WLm may be arranged parallel to each other between a first selection line DSL and a second selection line SSL as described in FIG. 3.

In addition, the memory device 110 may include a plurality of bit lines BL1 to BLn, where n is a natural number greater than or equal to 2. Each of the plurality of bit lines BL1 to BLn may be connected to one or more of the plurality of memory cells MC included in the memory device 110. In this case, each bit line may be connected to the memory cells through the string STR described in FIG. 3.

For example, among the plurality of memory cells MC included in the memory device 110, a first memory cell MC1 may be connected to the first word line WL1 among a plurality of word lines WL1 to WLm, and may be connected to the first bit line BL1 among the plurality of bit lines BL1 to BLn.

In embodiments of the present disclosure, the memory device 110 may program the first memory cell MC1 in a predetermined target program state.

The first memory cell MC1 may have a plurality of program states determined according to a threshold voltage, and the number of program states may be determined according to the number of bits of data stored in the first memory cell MC1.

For example, in FIG. 4, in the case that the first memory cell MC1 is a TLC, the first memory cell MC1 may have an erase state E or first to seventh program states P1 to P7 as a target program state. In this case, the target program state of the first memory cell MC1 may be determined according to data to be stored in the first memory cell MC1.

Hereinafter, a specific operation of programming the first memory cell MC1 by the memory device 110 into a target program state, will be described.

Figure 5:
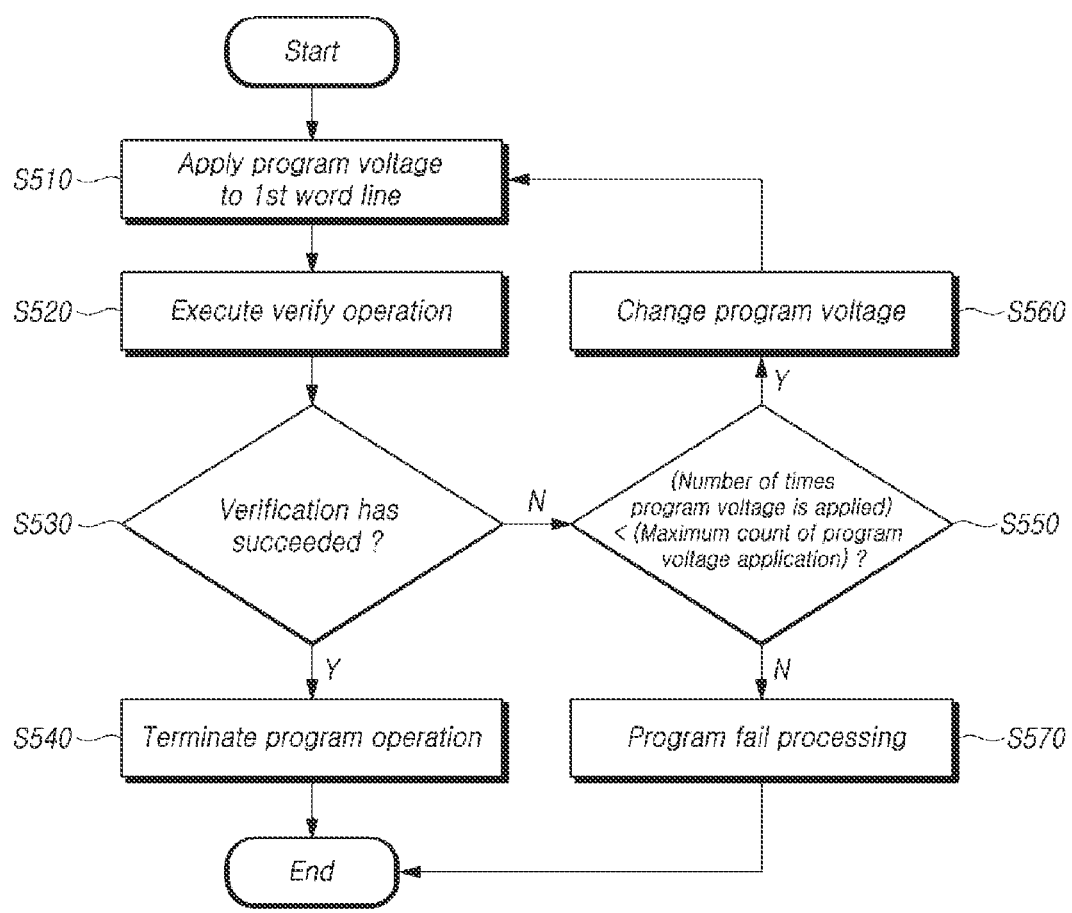
FIG. 5 is a flowchart illustrating an example of an operation of programming a first memory cell into a target program state by a memory device according to embodiments of the present disclosure.

FIG. 5 is a flowchart illustrating an example of an operation of programming a first memory cell MC1 into a target program state by a memory device 110 according to embodiments of the present disclosure.

First, the memory device 110 may applies a set program voltage to the first word line WL1 connected to the first memory cell MC1 to program the first memory cell MC1 in a set target program state (S510).

When the program voltage is applied to the first word line WL1, a set program allowable voltage may be applied to the first bit line BL1 connected to the first memory cell MC1 among the plurality of bit lines BL1 to BLn described above, and a set program prohibition voltage may be applied to the remaining bit lines except for the first bit line BL1.

The memory device 110 may perform a verify operation verifying whether the first memory cell MC1 is programmed in a target program state (S520). To this end, the memory device 110 may apply the set verification voltage to the first word line WL1 and may sense the voltage or current of the first bit line BL1 to determine whether a threshold voltage of the first memory cell MC1 exceeds the verification voltage.

The memory device 110 may determine whether the verification has succeeded as a result of executing the verify operation (S530). If the verification is successful (S530-Y), the memory device 110 may terminate the program operation for the first memory cell MC1 (S540).

On the other hand, if the verification has failed (S540-N), to determine whether to perform the program loop again, the memory device 110 determines whether the number of times the program voltage is applied to the first word line WL1 is greater than or equal to a set maximum count of program voltage application (S550).

If the number of times the program voltage is applied to the first word line WL1 is less than the maximum count of program voltage application (S550-Y), the memory device 110 may change the level of the program voltage before programming data in the first memory cell MC1 again (S560).

For example, in the case that the Incremental Step Program Pulse (ISPP) method is utilized, the memory device 110 may increase the level of the program voltage by a set step voltage. After executing operation S560, the memory device 110 may return to operation S510 again.

On the other hand, if the number of times the program voltage is applied to the first word line WL1 is greater than or equal to the maximum count of program voltage application (S550-N), the memory device 110 determines that the program operation has failed and may execute a program fail processing (S570). This is to prevent the memory device 110 from repeating the program loop infinitely when the verification continues to fail.

When the memory device 110 programs the first memory cell MC1 into a target program state, the memory device 110 may precharge a plurality of bit lines BL1 to BLn to make the voltage level of the plurality of bit lines BL1 to BLn a set target level. The precharging of the plurality of bit lines BL1 to BLn means raising the voltage level of each bit line to a set target voltage level to program the first memory cell MC1. In this case, the target voltage for each of the plurality of bit lines BL1 to BLn may be different from each other.

As an example, the memory device 110 may precharge so that the voltage level of the first bit line BL1 connected to the first memory cell MC1 among the plurality of bit lines BL1 to BLn becomes the program allowable voltage level, and the voltage level of the bit lines other than the first bit line BL1 becomes the program prohibition voltage level.

In this case, whether or not the voltage level of each bit line becomes a target level as a result of the precharge operation may be determined according to a time for precharging the bit line.

Figure 6:
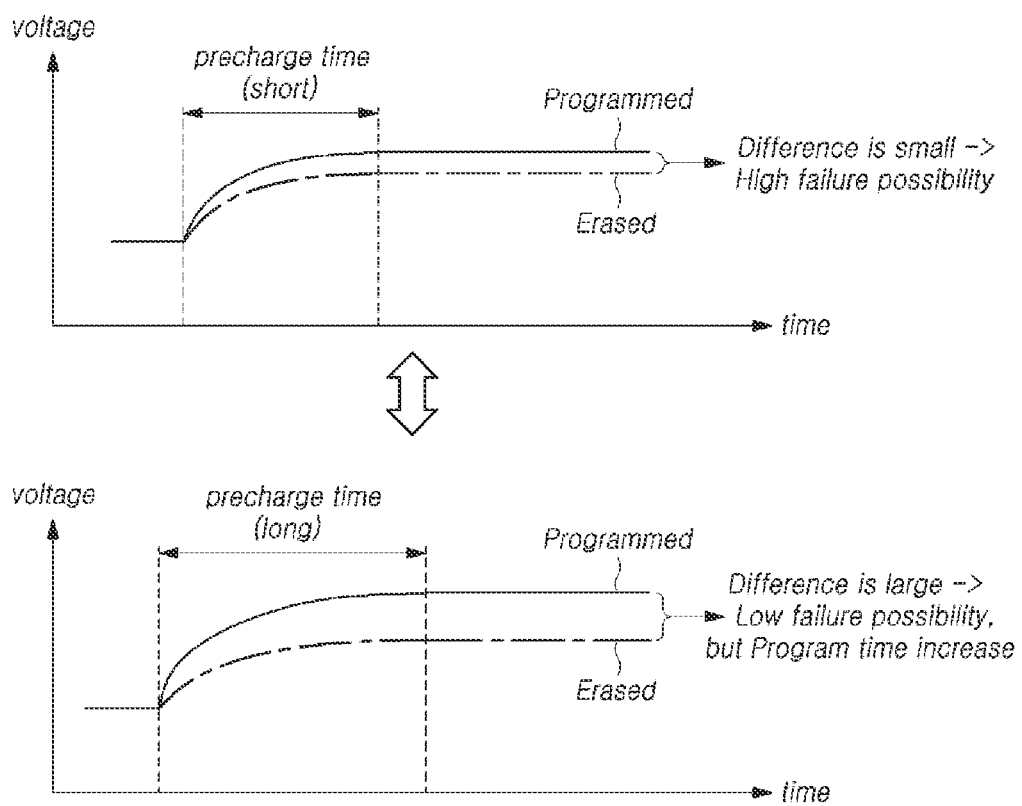
FIG. 6 illustrates a comparison of a voltage change of a bit line according to a time for precharging a bit line according to embodiments of the present disclosure.

FIG. 6 illustrates a comparison of a voltage change of a bit line according to a time for precharging a bit line according to an embodiment of the present disclosure.

Referring to FIG. 6, when the time for precharging the bit line is short, the voltage level of the bit line connected to the memory cell on which the program operation has been completed may not normally reach the target level. In this case, a difference between the voltage level of the bit line connected to the memory cell on which the program operation is completed and the voltage level of the bit line connected to the memory cell in the erase state may be set to be small.

In this case, when the memory device 110 executes the verify operation of verifying the program state of the memory cell, the possibility of erroneously determining the memory cell as being the erase state may increase even though the memory cell is actually a memory cell in which the program operation has been completed, thus increasing the possibility of occurrence of a program failure.

On the other hand, if the time for precharging the bit line is prolonged, the voltage level of the bit line connected to the memory cell in which the data program operation is completed may normally reach the target level. In this case, a difference between the voltage level of the bit line connected to the memory cell in which the program operation has been completed and the voltage level of the bit line connected to the memory cell in the erase state may be set to be large.

In this case, when the memory device 110 executes the verify operation of verifying the program state of the memory cell, it is less likely to erroneously determine that the memory cell is in the erase state even though the memory cell is actually a memory cell in which the program operation has been completed.

Therefore, to prevent program failure during the program operation, it is preferable that the memory device 110 precharges the plurality of bit lines BL1 to BLn as long as possible.

However, if the time for precharging the plurality of bit lines BL1 to BLn is prolonged, since the time required for the memory device 110 to precharge the bit line to program the memory cell increases, the overall time to program data in the memory cell may increase.

Accordingly, in embodiments of the present disclosure, in order to minimize the increase in program time in the case of increasing the time to precharge the bit line to prevent the program failure, the memory device 110 may set a time for precharging a bit line differently according to a specific condition. Hereinafter, this will be described in detail in FIG. 7.

Figure 7:
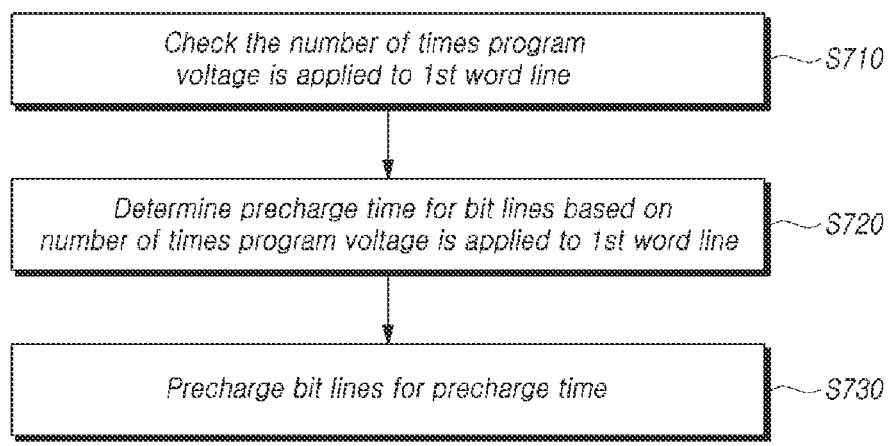
FIG. 7 is a flowchart illustrating an operation of a memory device according to embodiments of the present disclosure.

FIG. 7 is a flowchart illustrating an operation of a memory device 110 according to embodiments of the present disclosure.

Referring to FIG. 7, when programming the above-described first memory cell MC1 in a set target program state, the memory device 110 may identify or check the number of times the program voltage is applied to the first word line WL1 connected to the first memory cell MC1 (S710). In this case, the memory device 110 may check the number of times the program voltage is applied to the first word line WL1 from the start time of the programming operation of the first memory cell MC1 to the target program state.

The memory device 110 may determine a precharge time, which is a time for precharging a plurality of bit lines included in the memory device 110, based on the number of times the program voltage is applied to the first word line WL1 (S720).

In addition, when executing a verify operation for the first memory cell MC1, the memory device 110 may precharge a plurality of bit lines included in the memory device 110 during the precharge time determined in operation S720. (S730).

In this case, for example, the operation described with reference to FIG. 7 may be executed by the control logic 240 of the memory device 110.

Hereinafter, an example of an operation in which the memory device 110 determines a precharge time in operation S720 with reference to FIG. 8 will be described.

Figure 8:
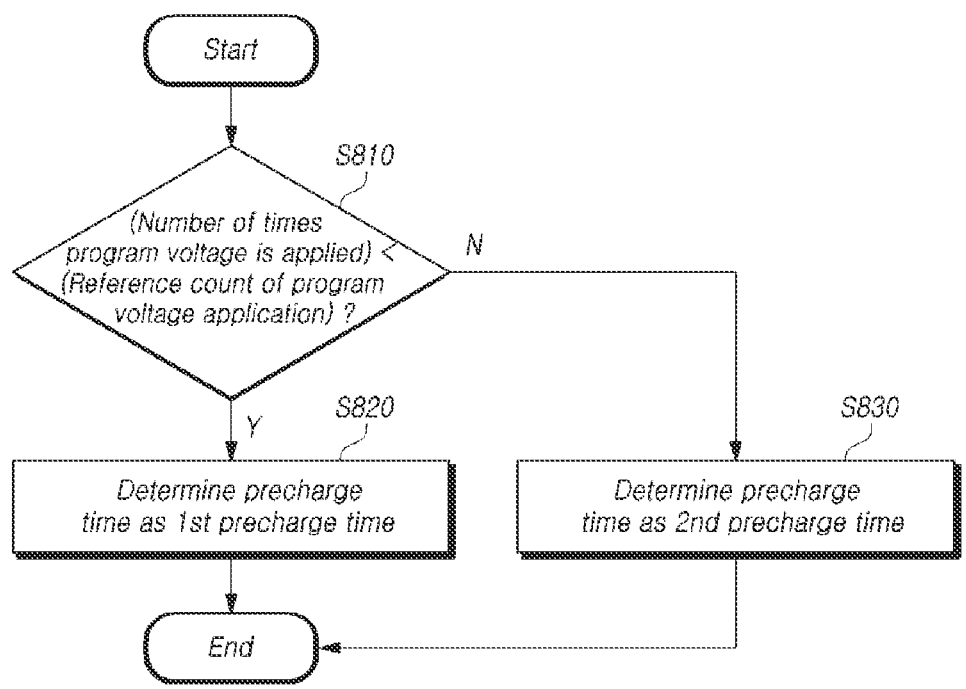
FIG. 8 is a flowchart illustrating an example of an operation of determining a precharge time by a memory device according to embodiments of the present disclosure.

FIG. 8 is a flowchart illustrating an example of an operation of determining a precharge time by a memory device 110 according to embodiments of the present disclosure.

Referring to FIG. 8, the memory device 110 may determine whether the number of times the program voltage is applied to the first word line WL1 is less than a specific reference count of program voltage application (S810).

When the number of times the program voltage is applied to the first word line WL1 is less than the reference count of program voltage application (S810-Y), the memory device 110 may determine a precharge time as a first precharge time (S820).

When the number of times the program voltage is applied to the first word line WL1 is equal to or greater than the reference count of program voltage application (S810-N), the memory device 110 may determine a precharge time as a second precharge time (S830).

In this case, the second precharge time may be longer than the first precharge time. That is, when programming data in the first memory cell MC1, the memory device 110 may initially set a short precharge time to terminate the program operation as quickly as possible.

When the number of times the program voltage is applied to the first word line WL1 exceeds a specific number (i.e., the reference count of program voltage application), the memory device 110 may set a precharge time longer than before to prevent a program failure from occurring due to a failure of the verify operation.

In some embodiments, the difference between the second precharge time and the first precharge time may be changed according to the characteristics of the memory device 110.

Figure 9:
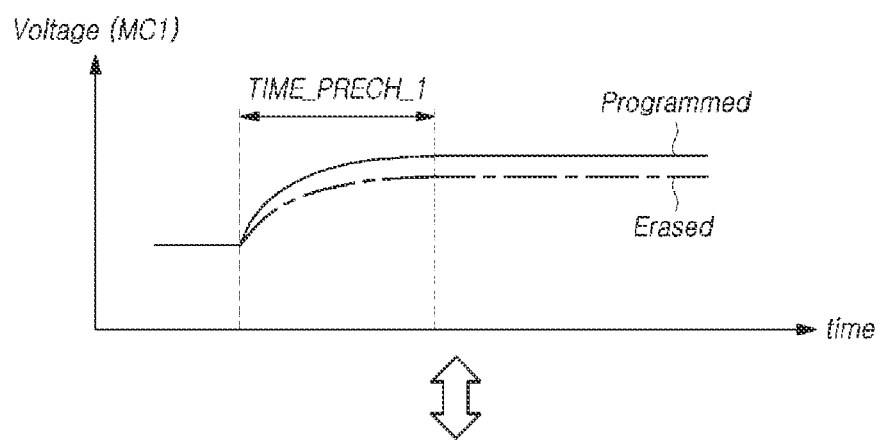
FIG. 9 is a diagram comparing precharge time and voltage change of a bit line according to the number of times a program voltage is applied when executing the operation described in FIG. 8 according to embodiments of the present disclosure.
Figure 9:
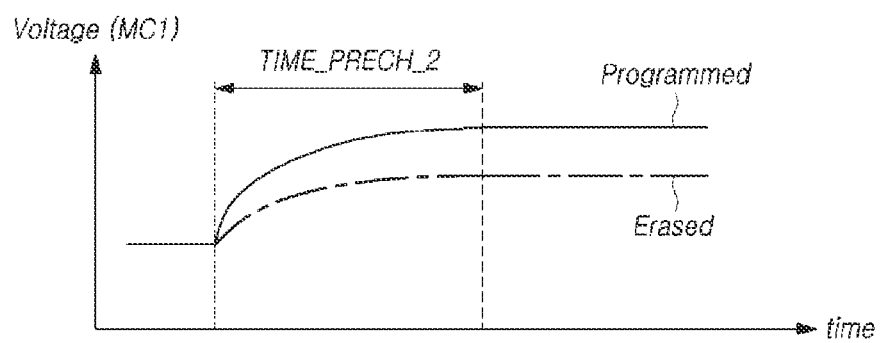

FIG. 9 is a diagram comparing precharge time and voltage change of a bit line according to the number of times a program voltage is applied when executing the operation described in FIG. 8 according to an embodiment of the present disclosure.

Referring to FIG. 9, when the number of times the program voltage is applied to the first word line WL1 is less than the reference count of program voltage application, the bit lines are precharged during the first precharge time TIME_PRECH_1. In this case, the difference between the voltage level of the bit line connected to the first memory cell MC1 on which the program operation has been completed and the voltage level of the bit line connected to the first memory cell MC1 in the erase state may be small. Accordingly, there may be a high possibility that the memory device 110 erroneously determines the first memory cell MC1 for which the program operation is actually completed as being in the erased state.

When the number of times the program voltage is applied to the first word line WL1 is equal to or greater than the reference count of program voltage application, the bit lines are precharged during the second precharge time TIME_PRECH_2. In this case, the difference between the voltage level of the bit line connected to the first memory cell MC1 on which the program operation has been completed and the voltage level of the bit line connected to the first memory cell MC1 in the erase state may be great. Accordingly, the possibility that the memory device 110 incorrectly determines the first memory cell MC1 for which the program operation has been actually completed as being in the erased state, is lowered.

In the above, it has been described the reference count of program voltage application, which is a reference for determining the precharge time. Depending on the manner in which the memory device 110 determines the reference count of program voltage application, there may be determined a time required for the memory device 110 to program a memory cell and a frequency of occurrence of a program failure during a program operation.

Hereinafter, an embodiment in which the memory device 110 determines the reference count of program voltage application will be described.

In embodiments of the present disclosure, the memory device 110 may group a plurality of word lines WL1 to WLm into a plurality of word line groups. In addition, the memory device 110 may differently determine the reference count of program voltage application according to the word line group. In this case, the reference count of program voltage application may be determined according to the word line group to which the first word line WL1 belongs. This is because when the memory device 110 executes a program operation on a memory cell, the program state of the corresponding memory cell may vary according to a word line connected to the memory cell.

The memory device 110 may store the reference count of program voltage application for each of the plurality of word line groups into a memory block including a plurality of word lines WL1 to WLm, or into a separate register for storing the reference count of program voltage application.

Figure 10:
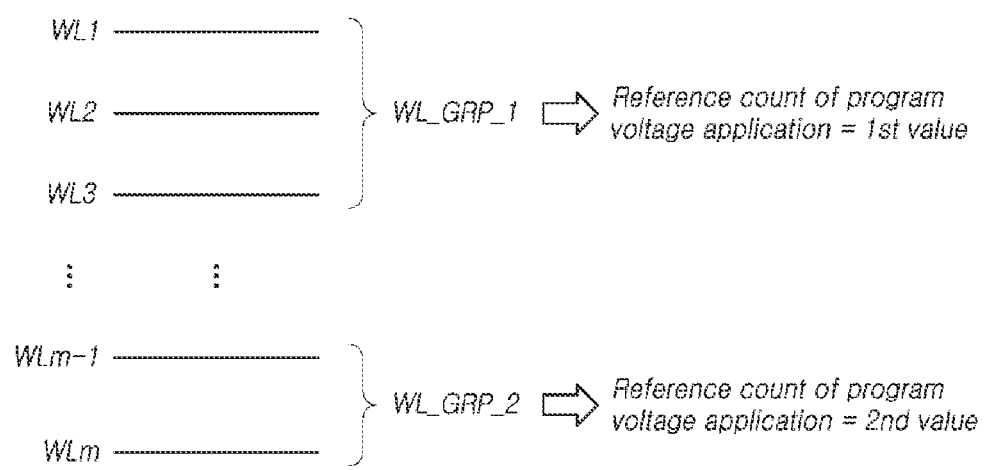
FIG. 10 illustrates an example in which a memory device according to embodiments of the present disclosure determines a reference count of program voltage application according to a word line group.

FIG. 10 illustrates an example in which a memory device 110 according to embodiments of the present disclosure, determines a reference count of program voltage application according to a word line group.

The memory device 110 may group a plurality of word lines WL1 to WLm into a plurality of word line groups. In addition, the memory device 110 may determine the reference count of program voltage application differently according to the word line group to which the first word line WL1 belongs.

In FIG. 10, the memory device 110 may group word lines WL1, WL2, WL3 among the plurality of word lines WL1 to WLm into a first word line group WL_GRP_1, and may group word lines WLm−1 and WLm into a second word line group WL_GRP_2. Furthermore, the memory device 110 may group the remaining word lines so that the remaining word lines belong to the first word line group WL_GRP_1, the second word line group WL_GRP_2 or a separate word line group.

In this case, when data is programmed in a memory cell connected to one of the word lines belonging to the first word line group WL_GRP_1, the memory device 110 may determine the reference count of program voltage application as the first value. In addition, when data is programmed in a memory cell connected to one of the word lines belonging to the second word line group WL_GRP_2, the memory device 110 determines the reference count of program voltage application as a second value, the second value being different from the first value.

When performing a program operation on a memory cell connected to one of the word lines included in the first word line group WL_GRP_1, the memory device 110 may set the reference count of program voltage application such that, when the number of times the program voltage is applied to the corresponding memory cell reaches the reference count of program voltage application, the probability that the corresponding memory cell reaches the target program state is greater than or equal to a predetermined level.

Hereinafter, embodiments in which the memory device 110 determines the reference count of program voltage application for the first word line group WL_GRP_1 will be described.

Figure 11:
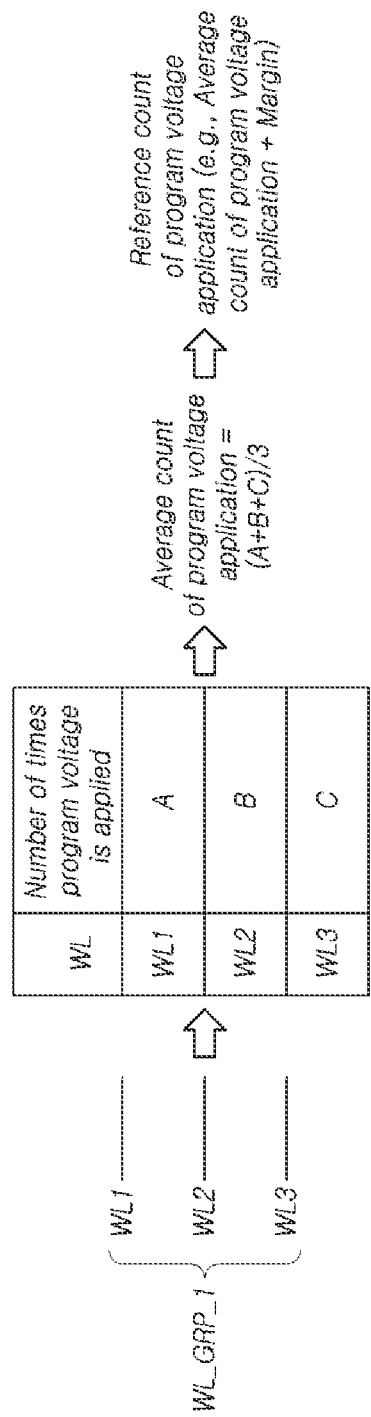
FIG. 11 illustrates an example in which a memory device according to embodiments of the present disclosure determines a reference count of program voltage application for the first word line group described in FIG. 10.

FIG. 11 illustrates an example in which a memory device 110 according to embodiments of the present disclosure determines a reference count of program voltage application for the first word line group WL_GRP_1 described in FIG. 10.

Referring to FIG. 11, the memory device 110 determines the reference count of program voltage application for the first word line group WL_GRP_1 based on an average count of program voltage application, which is an average of the number of times the program voltage is applied to one of the word lines included in the first word line group WL_GRP_1 during a program operation for memory cells connected to one of the word lines included in the first word line group WL_GRP_1

For example, in FIG. 11, the number of times the program voltage is applied to a first word line WL1 during a program operation for the memory cells connected to the first word line WL1 among the word lines included in the first word line group WL_GRP_1 is A, and the number of times the program voltage is applied to a second word line WL2 during a program operation for the memory cells connected to the second word line WL2 is B, and the number of times the program voltage is applied to a third word line WL3 during a program operation for the memory cells connected to the third word line WL3 is C.

In this case, the memory device 110 may determine the reference count of program voltage application for the first word line group WL_GRP_1 based on the average of A, B, and C, that is, (A+B+C)/3. As an example, the memory device 110 may determine the reference count of program voltage application for the first word line group WL_GRP_1 as a value obtained by adding a margin for the first word line group WL_GRP_1 to (A+B+C)/3.

FIG. 12 is a diagram for describing another example in which the memory device 110 according to embodiments of the present disclosure determines a reference count of program voltage application for the first word line group WL_GRP_1 described in FIG. 10.

Referring to FIG. 12, the memory device 110 may determine the reference count of program voltage application as a maximum count of program voltage application MAX_CNT that the program voltage is allowed to be applied to the first word line WL1 when executing a program operation on the first memory cell MC1.

In the case that the number of times the program voltage is applied to the first word line WL1 is greater than or equal to the maximum count of program voltage application when executing a program operation on the first memory cell MC1, even if the verify operation fails, it may be determined that the operation of programming data in the first memory cell MC1 has failed without applying the program voltage to the first word line WL1 again.

In this case, when the number of times the program voltage is applied to the first word line WL1 is less than the above-described maximum count of program voltage application MAX_CNT, the memory device 110 may determine the time for precharging the bit lines as a first precharge time TIME_PRECH_1. When the number of times the program voltage is applied to the first word line WL1 becomes the maximum count of program voltage application MAX_CNT, the memory device 110 may determine the time for precharging the bit lines as a second precharge time TIME_PRECH_2. That is, when the memory device 110 programs data in the first memory cell MC1, a case of precharging the bit lines during the second precharge time TIME_PRECH_2 may occur at most once.

Additionally, the maximum count of program voltage application MAX_CNT may be determined differently depending on which word line group the first word line WL1 belongs to.

Figure 13:
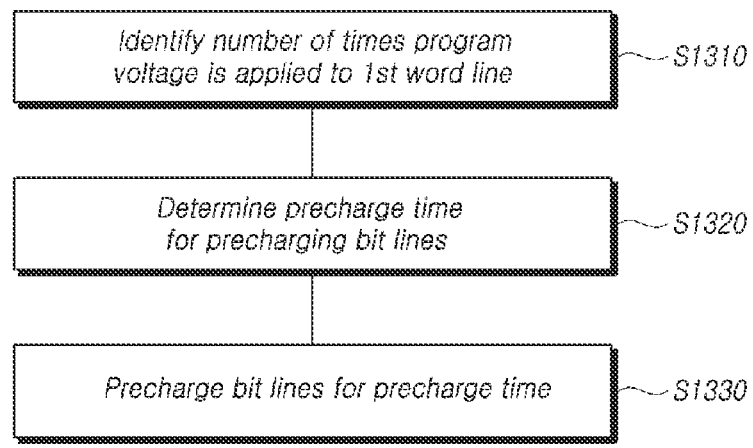
FIG. 13 illustrates a method of operating a memory device according to embodiments of the present disclosure.

FIG. 13 illustrates an operating method of a memory device 110 according to embodiments of the present disclosure.

Referring to FIG. 13, the operating method of the memory device 110 may include identifying or checking, when programming a first memory cell MC1 among the plurality of memory cells MC included in the memory device 110 to a set target program state, the number of times a program voltage is applied to a first word line WL1 connected to the first memory cell MC1 among the plurality of word lines WL1 to WLm included in the memory device 110 (S1310).

In addition, the operating method of the memory device 110 may include determining a precharge time, which is a time for precharging the plurality of bit lines BL1 to BLn included in the memory device 110, based on the number of times the program voltage is applied to the first word line WL1 (S1320)

The operation S1320 may include, for example, determining the precharge time as a first precharge time in the case that the number of times the program voltage is applied to the first word line WL1 is less than a reference count of program voltage application, and determining the precharge time as a second precharge time in the case that the number of times the program voltage is applied to the first word line WL1 is equal to or greater than the reference count of program voltage application. In this case, the second precharge time may be longer than the first precharge time.

The reference count of program voltage application may be determined depending on which word line group the first word line WL1 belongs to among a plurality of word line groups in which the plurality of word lines WL1 to WLm are grouped.

As an example, the reference count of program voltage application may be determined based on an average count of program voltage application, which is an average of the number of times the program voltage is applied to one of the word lines included in the word line group to which the first word line WL1 belongs, during a program operation for memory cells connected to one of the word lines included in the word line group to which the first word line WL1 belongs. In this case, the reference count of program voltage application may be determined as a value obtained by adding a margin for the word line group to which the first word line WL1 belongs to the average count of program voltage application.

As another example, the reference count of program voltage application may be a maximum count of program voltage application that the program voltage is allowed to be applied to the first word line WL1 when executing a program operation on the first memory cell MC1.

In addition, the operating method of the memory device 110 may include precharging the plurality of bit lines during the precharge time determined in S1320 when executing a verify operation on the first memory cell MC1 (S1330).

Figure 14:
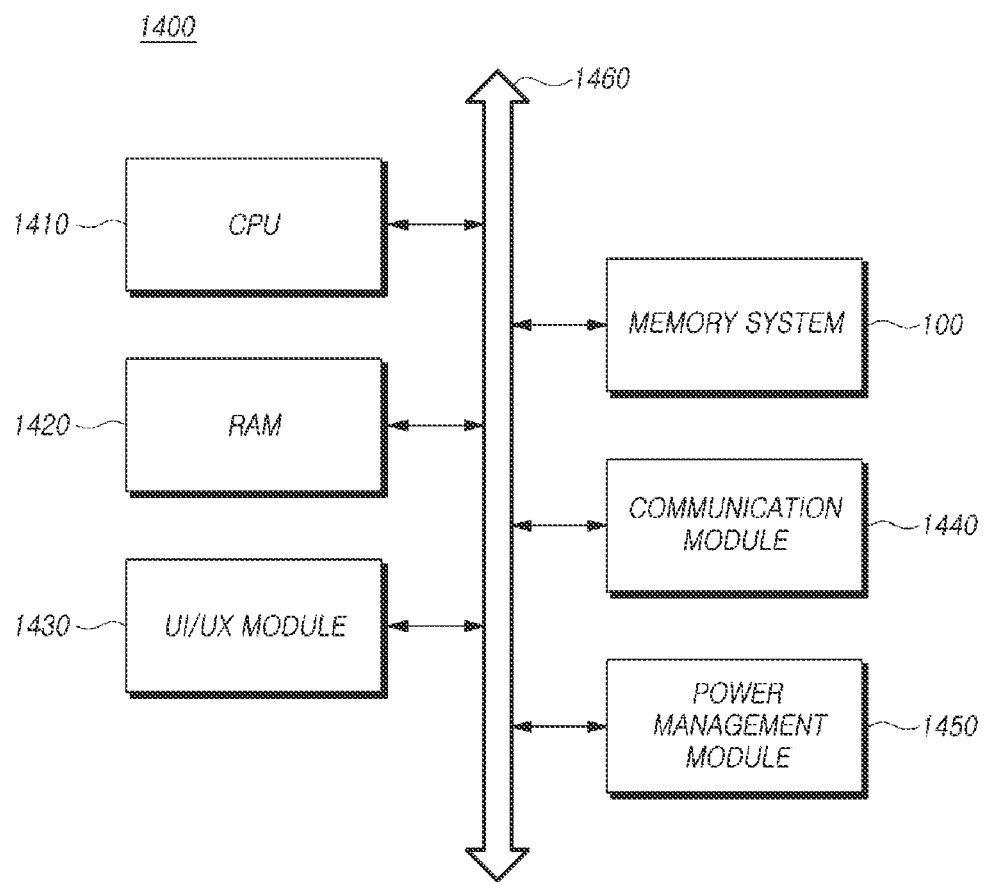
FIG. 14 is a diagram illustrating the configuration of a computing system based on some embodiments of the disclosed technology.

FIG. 14 is a diagram illustrating the configuration of a computing system 1400 based on an embodiment of the disclosed technology.

Referring to FIG. 14, the computing system 1400 based on an embodiment of the disclosed technology may include: a memory system 100 electrically connected to a system bus 1460; a CPU 1410 configured to control the overall operation of the computing system 1400; a RAM 1420 configured to store data and information related to operations of the computing system 1400; a user interface/user experience (UI/UX) module 1430 configured to provide the user with a user environment; a communication module 1440 configured to communicate with an external device as a wired and/or wireless type; and a power management module 1450 configured to manage power used by the computing system 1400.

The computing system 1400 may be a personal computer (PC) or may include a mobile terminal such as a smartphone, a tablet or various electronic devices.

The computing system 1400 may further include a battery for supplying an operating voltage, and may further include an application chipset, a graphic-related module, a camera image processor, and a DRAM. Other elements would be apparent to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the disclosed technology described above, the operation delay time of the memory system may be advantageously reduced or minimized. In addition, based on an embodiment of the disclosed technology, an overhead occurring in the process of calling a specific function may be advantageously reduced or minimized. Although various embodiments of the disclosed technology have been described with particular specifics and varying details for illustrative purposes, those skilled in the art will appreciate that various modifications, additions and substitutions may be made based on what is disclosed or illustrated in the present disclosure and the following claims. Furthermore, the embodiments may be combined to form additional embodiments.

What is claimed is:

1. A memory device comprising:
   a plurality of memory cells;
   a plurality of word lines connected to at least one of the plurality of memory cells; and
   a plurality of bit lines connected to at least one of the plurality of memory cells,
   wherein the memory device is configured to,
   determine, when programming a first memory cell among the plurality of memory cells to a target program state, a precharge time for precharging the plurality of bit lines based on a logical operation of a) determining and storing a reference count of program voltage application for a word line group containing multiple word lines to which the first word line belongs and b) determining whether a number of times that a program voltage is applied to the first word line connected to the first memory cell among the plurality of word lines exceeds the reference count for the word line group containing the multiple word lines, and precharge the plurality of bit lines during the precharge time when executing a verify operation on the first memory cell.

2. The memory device of claim 1, wherein, when the number of times that the program voltage is applied to the first word line is less than the reference count of program voltage application, the memory device determines a first precharge time to be the precharge time, wherein, when the number of times that the program voltage is applied to the first word line is equal to or greater than the reference count of program voltage application, the memory device determines a second precharge time to be the precharge time, and wherein the second precharge time is longer than the first precharge time.

3. The memory device of claim 2, wherein the memory device determines the reference count of program voltage application based on an average count of program voltage application, which is an average of the number of times that the program voltage is applied to the multiple word lines included in the word line group to which the first word line belongs during a program operation on memory cells connected to the word lines included in the word line group to which the first word line belongs.

4. The memory device of claim 3, wherein the memory device determines the reference count of program voltage application as a value obtained by adding, to the average count program voltage application, a margin for the word line group to which the first word line belongs.

5. The memory device of claim 2, wherein the memory device determines, as the reference count of program voltage application, a maximum count of program voltage application that the program voltage is allowed to be applied to the first word line when executing a program operation on the first memory cell.

6. An operating method of a memory device including a plurality of memory cells, a plurality of word lines connected to at least one of the plurality of memory cells, and a plurality of bit lines connected to at least one of the plurality of memory cells, the operating method comprising:

identifying, when programming a first memory cell among the plurality of memory cells to a target program state, a number of times that a program voltage is applied to a first word line connected to the first memory cell among the plurality of word lines;

determining a precharge time for precharging the plurality of bit lines based on a logical operation of a) determining and storing a reference count of program voltage application for a word line group containing multiple word lines to which the first word line belongs and b) determining whether the number of times that the program voltage is applied to the first word line connected to the first memory cell among the plurality of word lines exceeds the reference count for the word line group containing the multiple word lines; and precharging the plurality of bit lines during the precharge time when executing a verify operation on the first memory cell.

7. The operating method of claim 6, wherein the determining the precharge time comprises:

determining a first precharge time as the precharge time when the number of times that the program voltage is applied to the first word line is less than the reference count of program voltage application; and determining a second precharge time as the precharge time when the number of times that the program voltage is applied to the first word line is equal to or greater than the reference count of program voltage application, and wherein the second precharge time is longer than the first precharge time.

8. The operating method of claim 7, wherein the determining the reference count of program voltage application includes determining the reference count based on an average count of program voltage application, which is an average of the number of times that the program voltage is applied to the multiple word lines included in the word line group to which the first word line belongs during a program operation on memory cells connected to the word lines included in the word line group to which the first word line belongs.

9. The operating method of claim 8, wherein the determining the reference count of program voltage application includes determining the reference count as a value obtained by adding, to the average count of program voltage application, a margin for the word line group to which the first word line belongs.

10. The operating method of claim 7, wherein the determining the reference count of program voltage application includes determining, as the reference value, a maximum count of program voltage application that the program voltage is allowed to be applied to the first word line when executing a program operation on the first memory cell.

11. A memory device comprising:

memory cells commonly coupled to a word line and respectively coupled to bit lines; and a control logic configured to perform one or more program loops on a target cell among the memory cells, each program loop including a program step and a verify step, wherein the control logic performs the program step by applying a program voltage to the word line, and wherein the control logic performs the verify step by precharging the bit lines for a time amount corresponding to a current program loop among the program loops, wherein a precharge time for precharging the bit lines is based on a logical operation of a) determining and storing a reference count of program voltage application for a word line group containing multiple word lines to which the word line belongs and b) determining whether the number of times that the program voltage is applied to the word line among the plurality of word lines exceeds the reference count for the word line group containing the multiple word lines.

* * * * *